(12) United States Patent
Halberstadt

(10) Patent No.: US 10,897,201 B2
(45) Date of Patent: Jan. 19, 2021

(54) SWITCHED MODE POWER SUPPLY SIGNAL RECONSTRUCTION

(71) Applicant: NXP B.V., Eindhoven (NL)

(72) Inventor: Hans Halberstadt, Groesbeek (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/407,294

(22) Filed: May 9, 2019

(65) Prior Publication Data

US 2020/0358358 A1 Nov. 12, 2020

(51) Int. Cl.
*H02M 3/158* (2006.01)
*H02M 1/42* (2007.01)

(52) U.S. Cl.
CPC ....... *H02M 3/1582* (2013.01); *H02M 3/1588* (2013.01)

(58) Field of Classification Search
CPC .. H02M 3/335; H02M 3/33507; H02M 7/525; H02M 3/158; H02M 1/42–4266
See application file for complete search history.

(56) References Cited

U.S. PATENT DOCUMENTS

| | | | |
|---|---|---|---|
| 3,657,622 A * | 4/1972 | Reuland | H02P 25/26 318/819 |
| 5,777,866 A | 7/1998 | Jacobs et al. | |
| 5,818,707 A | 10/1998 | Seong et al. | |
| 5,966,382 A * | 10/1999 | Fawal | H04L 25/0266 370/419 |
| 6,314,005 B1 * | 11/2001 | Nishi | H02M 3/33523 363/21.08 |
| 6,879,136 B1 | 4/2005 | Erisman et al. | |
| 9,042,127 B2 * | 5/2015 | Gong | H05B 45/37 363/21.13 |
| 9,331,588 B2 * | 5/2016 | Chen | H02M 3/33523 |
| 10,158,282 B1 | 12/2018 | Maruyama | |
| 10,541,618 B2 * | 1/2020 | Gong | H02M 3/156 |
| 2004/0155639 A1 * | 8/2004 | Mobers | H02M 3/33523 323/282 |
| 2006/0245219 A1 * | 11/2006 | Li | G05F 1/565 363/89 |
| 2007/0024365 A1 * | 2/2007 | Ramaswamy | H03F 1/30 330/251 |
| 2008/0198525 A1 * | 8/2008 | Janssen | H03K 17/0828 361/93.1 |
| 2008/0316779 A1 * | 12/2008 | Jayaraman | H02M 1/4225 363/74 |

(Continued)

FOREIGN PATENT DOCUMENTS

WO WO-03/003554 A1 1/2003

OTHER PUBLICATIONS

Mohomad AR, Haider et al; "Removal of Measurement Noise Spikes in Grid-Connected Power Converters"; 4th IEEE Int'l Symposium on Power Electronics for Distributed Generation Systems; 5 pages (Jul. 8, 2013).

*Primary Examiner* — Thienvu V Tran
*Assistant Examiner* — Sisay G Tiku

(57) ABSTRACT

A switched mode power supply including an alternating current power supply configured to output a voltage, a sense resistor configured to sense a voltage output from the power supply, a current sense processor configured to sense a current level through the sense resistor, sense disturbances in the sensed voltage, and reconstruct the sensed voltage to eliminate the disturbances.

22 Claims, 9 Drawing Sheets

(56) References Cited

U.S. PATENT DOCUMENTS

| | | | |
|---|---|---|---|
| 2009/0016087 A1* | 1/2009 | Shimizu | H02M 1/4225 |
| | | | 363/89 |
| 2012/0327691 A1* | 12/2012 | Strijker | H02M 1/32 |
| | | | 363/21.01 |
| 2015/0303790 A1* | 10/2015 | Lin | H02M 1/4225 |
| | | | 363/89 |
| 2017/0093218 A1* | 3/2017 | Hrinya | H02J 7/025 |
| 2018/0006577 A1* | 1/2018 | Ng | H02M 7/525 |
| 2018/0226877 A1* | 8/2018 | Fukumoto | H02M 3/1588 |

* cited by examiner

SWITCHED MODE POWER SUPPLY SIGNAL RECONSTRUCTION

TECHNICAL FIELD

Example embodiments disclosed herein relate generally to a method for reconstruction of a signal from a disturbed signal in a switched mode power supply (SMPS) using information of the shape of the signal.

SUMMARY

A brief summary of various example embodiments is presented below. Some simplifications and omissions may be made in the following summary, which is intended to highlight and introduce some aspects of the various example embodiments, but not to limit the scope of the invention. Detailed descriptions of example embodiments adequate to allow those of ordinary skill in the art to make and use the inventive concepts will follow in later sections.

Various embodiments relate to a switched mode power supply, including: an alternating current power supply configured to output a voltage; a sense resistor configured to sense a voltage in a powerfactor correction stage; a current sense processor configured to sense a current level through the sense resistor and reconstruct the sensed voltage to eliminate disturbances in a voltage across the sense resistor.

Various embodiments are described, wherein disturbances include voltage spikes in a rising and falling edge of the sensed voltage.

Various embodiments are described, wherein the current sense processor includes a reconstruction apparatus that is configured to input the sensed voltage having disturbances and output a reconstructed voltage signal free of disturbances, wherein the sensed voltage and reconstructed voltage signal have substantially the same amplitude and frequency.

Various embodiments are described, wherein the reconstruction apparatus is configured to take a derivative of the sensed voltage and a derivative of the reconstructed voltage and determine a difference therebetween, wherein the difference provides a first error signal that is fed back and integrated in the reconstruction apparatus to update the output reconstructed voltage.

Various embodiments are described, wherein the reconstruction apparatus is configured to take the sensed voltage and the reconstructed voltage and determined a difference therebetween, wherein the difference provides a second error signal that is fed back and integrated in the reconstruction apparatus to update the output reconstructed voltage.

Various embodiments are described, wherein the reconsruction apparatus includes a primary stroke circuit configured to create a rising edge of the reconstruction voltage signal and a secondary stroke circuit configured to create a falling edge of the reconstruction voltage signal.

Various embodiments are described, wherein the primary stroke circuit includes a plurality of switches configured to route error signals to an integrator.

Various embodiments are described, wherein the reconstruction apparatus includes at least one filter, wherein the at least one filter is configured to output a desired slope for the reconstructed voltage signal based upon an error signal.

Various embodiments are described, wherein the reconstruction apparatus includes at least one filter, wherein the at least one filter is configured to output a desired slope for the sensed voltage signal when there is no error present.

Further various embodiments relate to a method of reconstructing a power supply signal, including: outputting a power supply voltage; sensing a voltage in a powerfactor correction stage using a sense resistor; sensing a current level of the output voltage through the sense resistor and reconstructing the sensed voltage to eliminate disturbances in a voltage across the sense resistor.

Various embodiments are described, wherein disturbances include voltage spikes in a rising and falling edge of the sensed voltage.

Various embodiments are described, further including inputting the sensed voltage having disturbances and outputting a reconstructed voltage signal free of disturbances, wherein the sensed voltage and reconstructed voltage signal have substantially the same amplitude and frequency.

Various embodiments are described, further including taking a derivative of the sensed voltage and a derivative of the reconstructed voltage and determining a difference therebetween, wherein the difference provides a first error signal that is fed back and integrated in a reconstruction apparatus to update the output reconstructed voltage.

Various embodiments are described, further including taking the sensed voltage and the reconstructed voltage and determining a difference therebetween, wherein the difference provides a second error signal that is fed back and integrated into a reconstruction apparatus to update the output reconstructed voltage.

Various embodiments are described, further including creating a rising edge of the reconstruction voltage signal using a primary stroke circuit and creating a falling edge of the reconstruction voltage signal using a secondary stroke circuit.

Various embodiments are described, further including routing error signals to an integrator using a plurality of switches.

Various embodiments are described, further including outputting a desired slope by a filter for the reconstructed voltage signal base upon an error signal.

Various embodiments are described, further including outputting a desired slope by a filter for the sensed voltage signal when there is no error present.

Further various embodiments relate to a switched mode power supply, including: a Vmains power supply to generate a Vmains signal; a power factor correction stage to improve a quality of the Vmains signal; a Vmains processor configured to sense the Vmains signal, wherein the Vmains processor is configured to derive timing from the sensed Vmains signal and to produce a square wave signal based upon the derived timing; a first integrator to receive the square wave signal and output a first integrated signal; a second integrator configured to receive and integrate the first integrated signal and output a second integrated signal having a sinewave replacement of the sensed Vmains signal.

Various embodiments are described, further including a first reset input for the first integrator wherein the first integrator is reset at a middle of each half of the sensed Vmains signal.

Various embodiments are described, further including a second reset input for the second integrator wherein the second integrator is reset at each slope of the first integrated signal.

Various embodiments are described, wherein the first integrated signal is triangular wave.

Various embodiments are described, wherein Vmains processor includes a peak detector that detects an amplitude of the sensed mains signal.

Various embodiments are described, further including an error loop, the error loop including, a peak detector configured to compare the amplitude to a peak value of the second integrated signal; and a regulator configured to adapt a parameter of the amplitude of the second integrated signal by multiplying the mains signal with an output of the regulator.

Further various embodiments relate to a method of reconstructing a sensed Vmains signal, including: receiving a Vmains signal from a Vmains power supply; improving a quality of the Vmains signal using a power factor corrector; sensing the Vmains signal and deriving timing from the sensed Vmains signal using a Vmains processor; produce a square wave signal based upon the derived timing; integrating the square wave signal and outputting a first integrated signal; receiving and integrating the first integrated signal and outputting a second integrated signal having a sinewave replacement of the sensed Vmains signal.

Various embodiments are described, further including resetting the first integrator at a middle of each half of the sensed Vmains signal.

Various embodiments are described, further including resetting the second integrator at each slope of the first integrated signal.

Various embodiments are described, wherein the first integrated signal is triangular wave.

Various embodiments are described, further including detecting an amplitude of the sensed mains signal.

Various embodiments are described, further including comparing the amplitude to a peak value of the second integrated signal and adapting a parameter of the amplitude of the second integrated signal by multiplying the mains signal with an output of the regulator.

BRIEF DESCRIPTION OF THE DRAWINGS

Additional objects and features of the invention will be more readily apparent from the following detailed description and appended claims when taken in conjunction with the drawings. Although several example embodiments are illustrated and described, like reference numerals identify like parts in each of the figures, in which:

DETAILED DESCRIPTION

Figure 1:
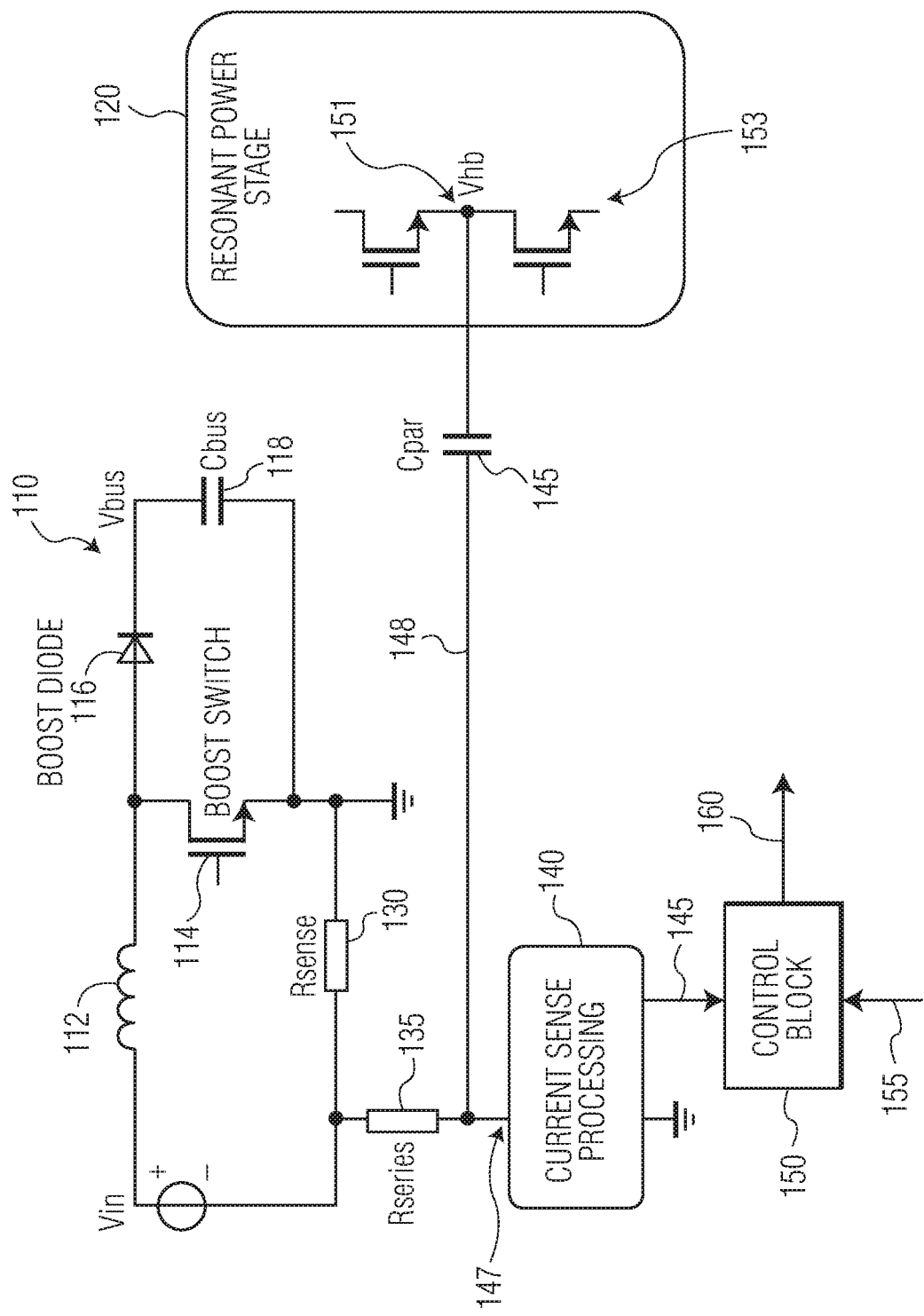
FIG. 1 illustrates a resonant power supply in accordance with example embodiments described herein.

It should be understood that the figures are merely schematic and are not drawn to scale. It should also be understood that the same reference numerals are used throughout the figures to indicate the same or similar parts.

The descriptions and drawings illustrate the principles of various example embodiments. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various example embodiments described herein are not necessarily mutually exclusive, as some example embodiments can be combined with one or more other example embodiments to form new example embodiments. Descriptors such as "first," "second," "third," etc., are not meant to limit the order of elements discussed, are used to distinguish one element from the next, and are generally interchangeable. Values such as maximum or minimum may be predetermined and set to different values based on the application.

In a switched mode power supply some signals are disturbed because of switching action as a large voltage over time (dv/dt) occurs. In some systems, a resonant power supply may include a power factor corrector (PFC) stage followed by an inductive capacitance (LLC) resonant converter power stage. A switching node of the LLC (Vhb) results in some parasitic coupling via a parasitic capacitance Cpar along a current sense path in the PFC stage.

FIG. 1 illustrates a resonant power supply 100 in accordance with example embodiments described herein. The resonant power supply 100 includes a boost converter circuit 110 followed by a resonant converter power stage 120. The resonant converter power stage may also be called a power factor corrector (PFC) stage. The boost converter circuit 110 may boost an input current. The boost converter circuit 110 may include a voltage source Vin and a series inductor 112. In parallel with the voltage source Vin may be a boost switch 114. The boost switch 114 may be an NMOS transistor. The series inductor 112 may store a current during a first time period when the boost switch 114 is off. In series with the series inductor 112 may be a boost diode 116 and bus capacitor 118. The boost diode 116 may regulate an amount of current that may pass to the bus capacitor 118. In an on state, the boost switch 114 may route current to a ground node and restrict the boost converter circuit 110 to current sensing by a current sense processor 140. In the off state, the boost switch 114 may enable current to flow to a bus capacitor 118.

A negative terminal of the voltage source Vin may be connected in series with a sense resistor 130 and a series resistor 135. A voltage sensed across sense resistor 130 may be used by the current sense processor 140 to generate a signal as a representation of a momentary current 145. This momentary current 145 is then compared in a control block 150 with a reference current 155 and used to furnish the actual switch conduction interval 160 of the boost switch.

The boost converter circuit 110 may be controlled in the current domain. Current sensing of input current may take place during a primary slope and a secondary slope. Current is used to control timing of the boost switch 114. However, the current can be disturbed by the resonant converter power stage 120.

For reasons such as inrush current protection, the series resistor 135 may be added to the boost converter circuit 110 to prevent large currents from flowing into an input node 147 of the current sense processor 140.

The additional series resistor 135 however increases the resistance of the input node 147. The result is that parasitic capacitive coupling 149 is added to a switching node 151 of the resonant converter power switch 153 that causes disturbances such as voltage spikes at the sensed signal 148. Such voltage spikes occur at a different frequency than the switching frequency of the boost converter 110. The result is that the current sense processor 140 makes the wrong decision sometimes as result of such spikes. Example embodiments eliminate the voltage spike disturbances without distorting the original current signal.

Figure 2:
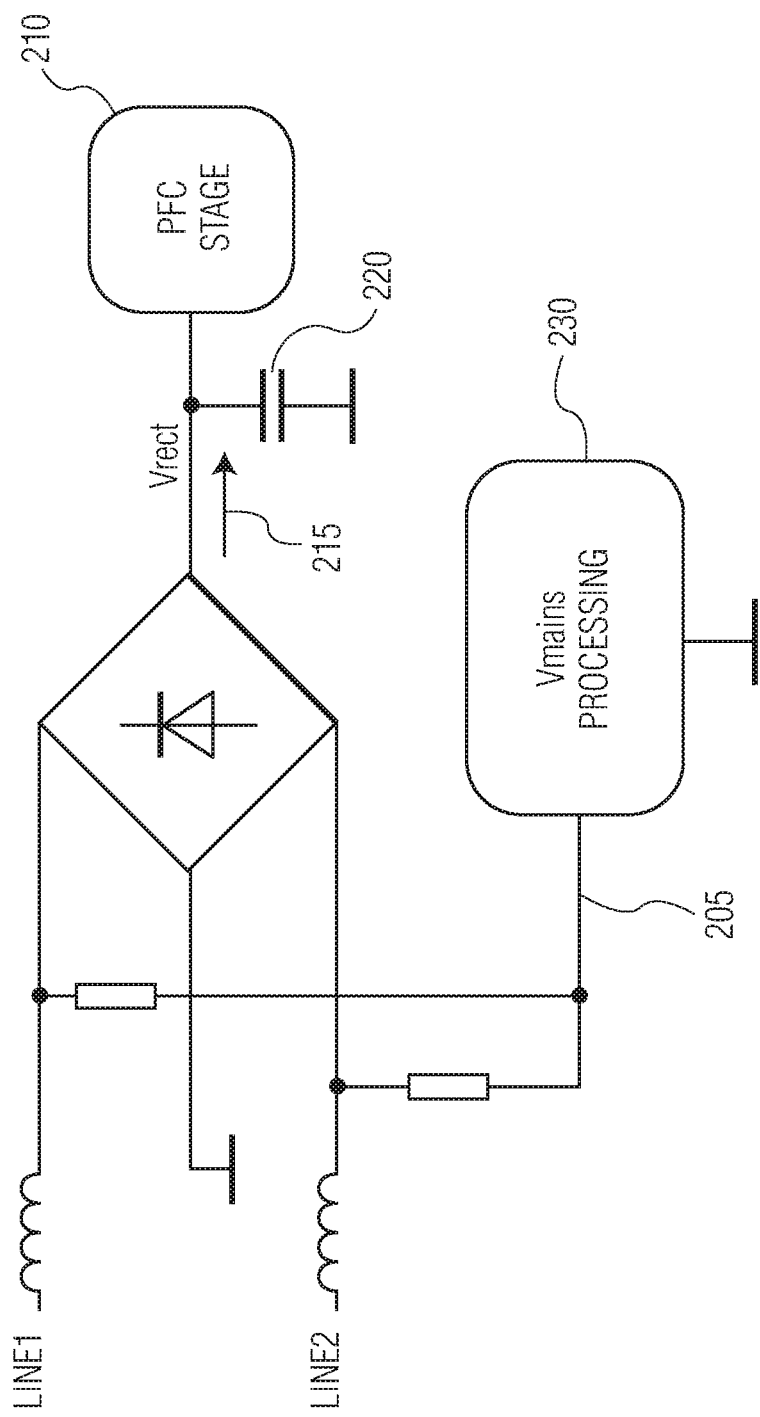
FIG. 2 illustrates a circuit configured for Vmains sensing in accordance with example embodiments described herein.

Another example, as shown in FIG. 2, is a PFC stage 210 where an electromagnetic interference (EMI) filter 220 is added. In such a PFC stage 210, a mains voltage 205 across lines 1 and 2 is sensed by a resistive path and processed by a Vmains processing block 230 to give a signal indicating a momentary Vmains value as input for the PFC stage 210.

One concept of controlling the PFC stage 210 makes the PFC stage 210 draw an input current 215 proportional to a momentary mains voltage. By using a sensed signal, the EMI filter 220 produces distortion of the sensed Vmains signal 205 when there is a distortion in the PFC input current. Such a distortion can amplify itself and produce instabilities. Replacement of the sensed mains voltage 205 by a signal with a same shape and amplitude but without the instabilities may prevent a situation where such instabilities can amplify and give oscillations. A replacement signal is discussed with respect to FIGS. 8 and 9 and other example embodiments described herein.

Figure 3:
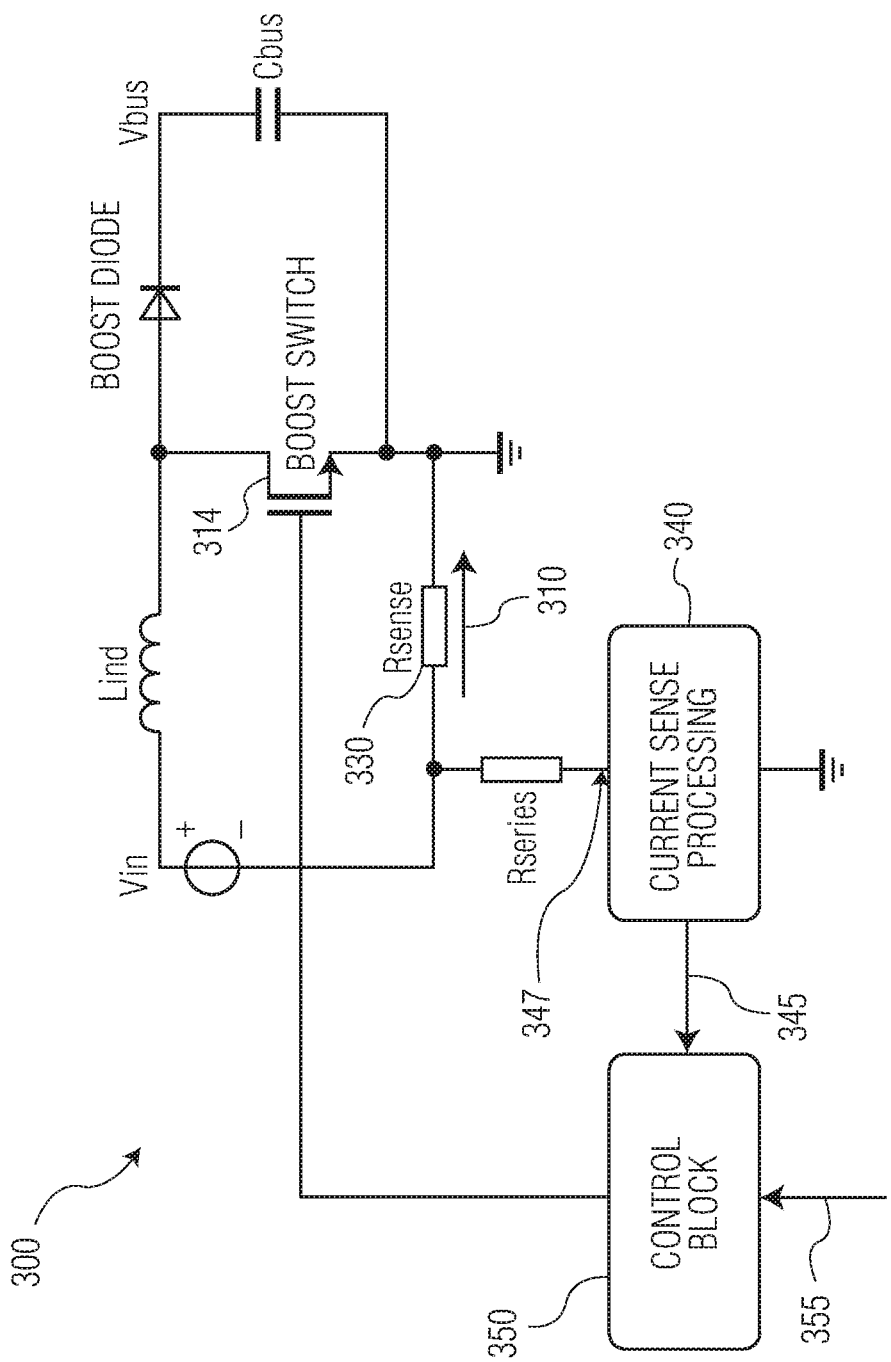
FIG. 3 illustrates a sensed current signal in a switched mode power supply in accordance with example embodiments described herein.

FIG. 3 illustrates a sensed current signal in a switched mode power supply in accordance with example embodiments described herein. FIG. 3 illustrates a sensed current signal 310 in a switched mode power supply (SMPS) 300. The SMPS 300 may be a boost converter used as power factor correction circuit. The sensed current signal 310 may be determined from a voltage Vsense across a sense resistor Rsense 330.

The sensed voltage Vsense is used by a current sense Isense processing block 340 to generate a signal 345 as a representation of the momentary current. This signal 345 is then compared in a control block 350 with a reference signal 355 and used to furnish the actual switch conduction interval of the boost switch 314.

Figure 4:
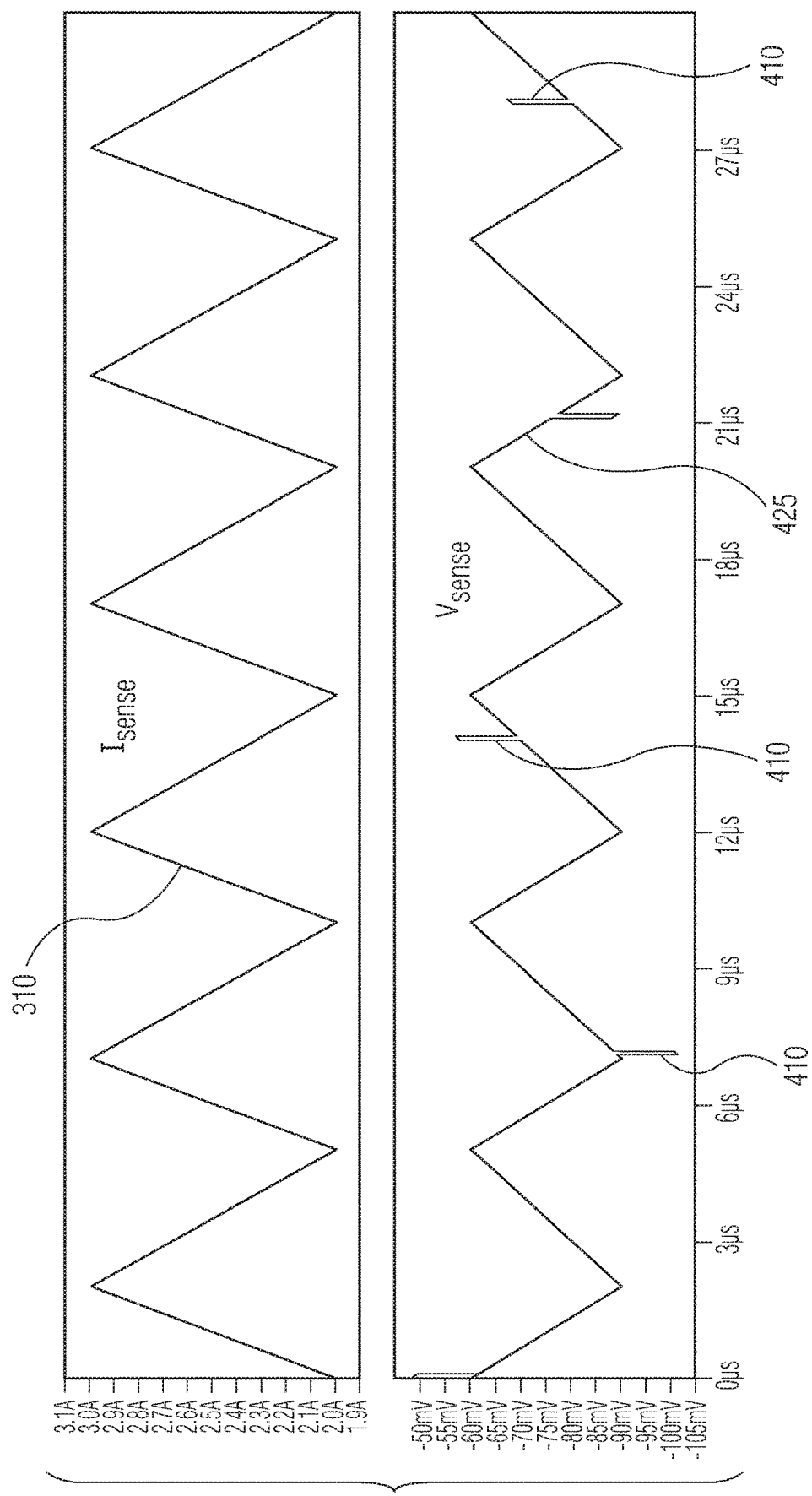
FIG. 4 illustrates a sensed current and a sensed voltage signal in accordance with FIG. 1.

FIG. 4 illustrates a sensed current and a sensed voltage signal in accordance with FIG. 1. FIG. 4 illustrates what the sensed current signal 310 at the current sense input 347 looks like (Vsense), as a result of a parasitic disturbance by the 2nd stage of the power converter in relation to the original current flowing in the sense resistor (Isense)

Because a switching frequency of the 2nd stage is different from the PFC switching frequency, spikes 410 may occur at any moment during the switching cycle, giving serious issues with finishing a conduction interval based on sensed current. In order to eliminate the spikes, the current sense processor 340 includes circuitry and programs configured to reconstruct the Vsense wave shape, eliminating the spikes and keeping the shape of the sensed current. A block diagram of the reconstruction apparatus is given in FIG. 5

Figure 5:
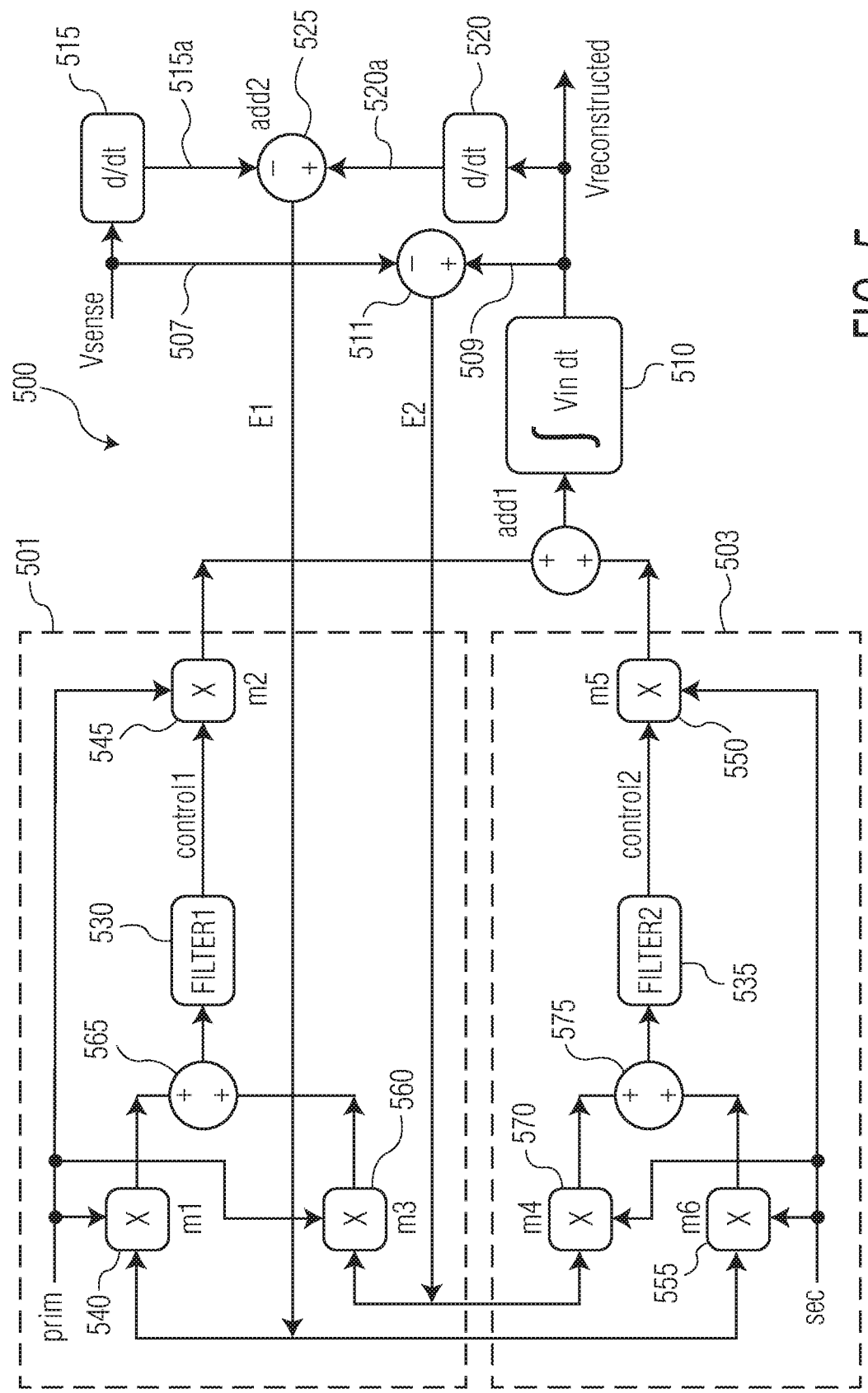
FIG. 5 illustrates a reconstruction apparatus of the current sense processor in accordance with FIG. 1.

FIG. 5 illustrates a reconstruction apparatus 500 of the current sense processor 140 in accordance with FIG. 1. The reconstruction apparatus 500 may be configured to determine a Vreconstructed signal from the sensed signal Vsense. The reconstruction apparatus 500 may include several components. The reconstruction apparatus 500 may include a primary stroke circuit 501 and a secondary stroke circuit 503 under the direction of a controller (not illustrated). The primary stroke circuit 501 may be used to construct a primary edge, or rising edge of the Vreconstructed signal. The secondary stroke circuit 503 may be used to construct a secondary edge, or falling edge, of the Vreconstructed signal. The reconstruction apparatus 500 may include an integrator 510 that is configured to integrate a constant in order to generate the output signal Vreconstructed having a well defined shape.

The primary stroke circuit 501 may include selector switches 540 and 560 to select respective error signals E1 and E2. The primary stroke circuit 501 may include an adder 565 to sum the two error signals together. The summed error signals may be input to a filter 530. A third selector 545 may be used to select a control1 signal from the filter 530.

The secondary stroke circuit 503 includes similar components including selectors 555 and 570, adder 575, filter 535, and selector 550 that operate in a similar manner to the components of the primary stroke circuit 501. Whether the primary stroke circuit 501 or the secondary stroke circuit 503 is selected to deliver the integration constant (control1, control2) as input to the integrator 510, in order to reconstruct the primary or secondary stroke current shape is determined by a controller (not illustrated).

The sensed current including the disturbance spike 410 is driven through the resistor Rsense and is represented by the signal 'Vsense'

The sensed voltage Vsense illustrated in FIG. 4 has three properties including a slope of the rising edge 415 of the signal, a slope of the falling edge 425 of the signal, and a DC value of the signal measured in mV, for example. In order to reconstruct both a rising slope and a falling slope, the reconstructed signal Vreconstructed may also have these properties.

In a signal reconstruction circuit to eliminate the spike disturbances 410, in block 515 the derivative d/dt of signal Vsense is determined as signal 515$a$. In block 520 the derivative d/dt of signal Vreconstructed is determined as signal 520$a$. These representative signals 515$a$ and 520$a$ may be representation of respective slopes of Vsense and Vreconstructed. A difference of the derivative signals 515$a$ and 520$a$ is taken in adder 525 to define a first error signal E1.

At substantially the same time, a difference between a voltage signal 507 from Vsense and a voltage integrated signal 509 from Vreconstructed is taken at the adder 511 to produce an error signal E2. To approximate a rising edge of Vreconstructed during the primary stroke circuit 501, the error signal E1 is selected by the switch 540 and the error signal E2 is selected by the switch 560 as described herein.

Therefore, three selectors 540, 560, and 545 (indicated by multipliers) will enable the error signal E1 to make changes to the state of filter 530 (control1). The output control1 of filter 530 is the desired positive slope for the reconstructed signal. When there is no error, the output control1 of filter 530 is the desired slope of the Vsense signal. When there are differences between the Vreconstructed voltage and the Vsense voltage, the measured error changes the output control of filter 530 to correct for the error until the error becomes approximately zero. Control1 may then be integrated by the integrator 510 during the primary stroke circuit 501. Outside the primary interval 610 (illustrated in FIG. 6)

the filter 530 state is not changed, and no integration takes place of control1 in that interval.

The same procedure holds during the secondary stroke circuit 503 (sec) through selectors 550 and 560, and filter 535. The filter 535 produces the desired negative slope for the reconstructed signal similar to the filter 530. A second control signal control2 may then be integrated using the integrator 510 during the secondary stroke circuit 503 after being selected by selector 550. An initial value of Vreconstructed at the beginning of the secondary stroke circuit 503 may then be automatically equal to the last value at the end of the primary stroke circuit 501 as the Vreconstructed may be a continuous signal similar to the Vsense signal.

Figure 6:
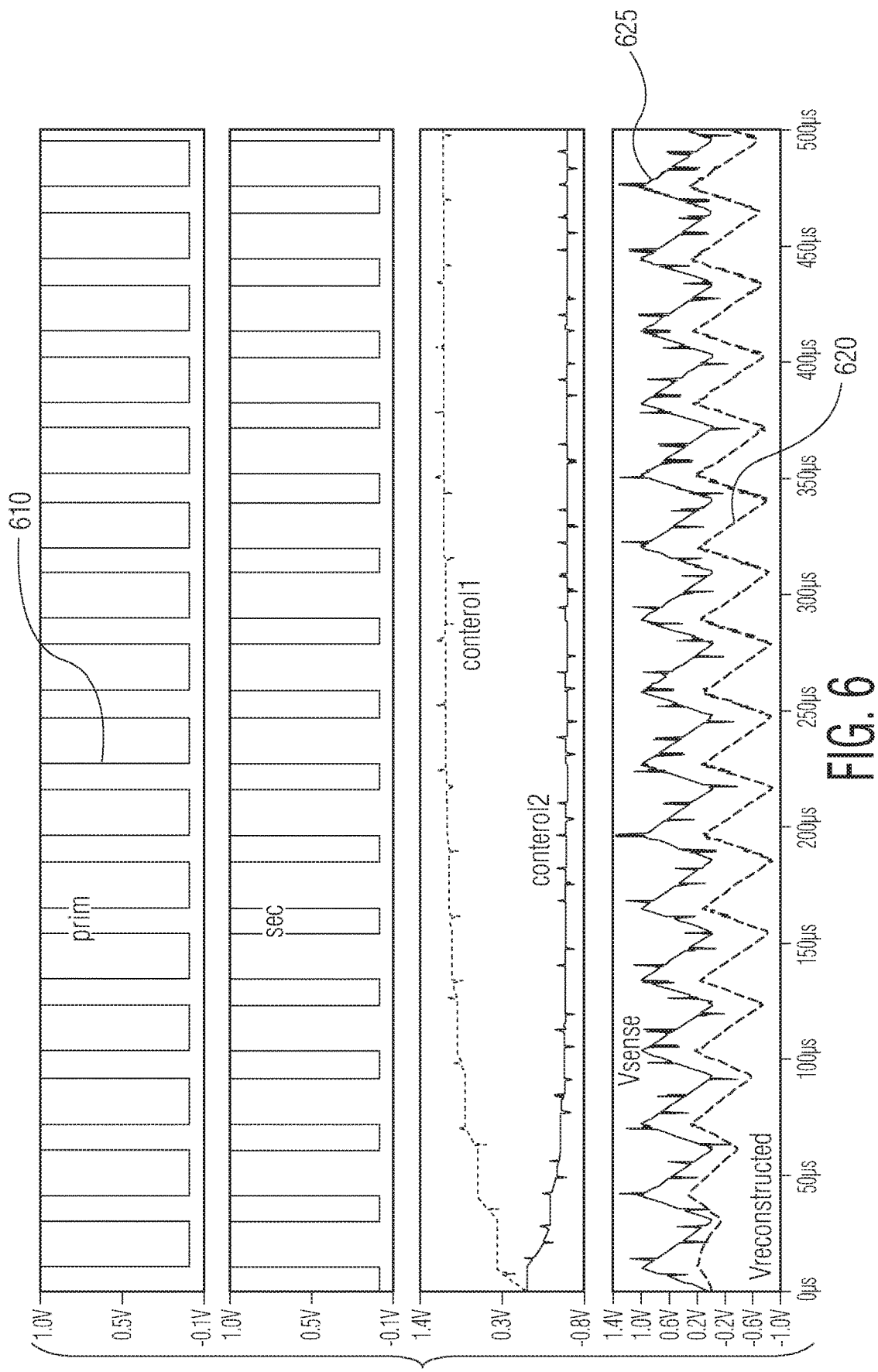
FIG. 6 illustrates representative signals including Vreconstructed in accordance with FIG. 5.

FIG. 6 illustrates representative signals including Vreconstructed 620 in accordance with FIG. 5. The control signals control1 and control2 may adapt to obtain proper slopes. Control 1 is used for the rising slope. Control2 is used for the falling slope. However, as illustrated, the DC term of Vreconstructed 620 is not settled to the proper value yet.

In order to define the proper DC term, as described herein the second error signal E2 may be generated, based on the difference between an integrated Vreconstructed and the sensed Vsense. As illustrated in FIG. 6, the Vreconstructed signal 620 tracks the shape and size of Vsense 625, but without the unwanted spikes. The E2 signal passes a similar selector switch 560, and is then added by the adder 565 to filter 530 during the primary stroke. Similarly, the E2 signal passes selector 570, and is then also added by the adder 575 to filter 535 during the secondary stroke.

Figure 7:
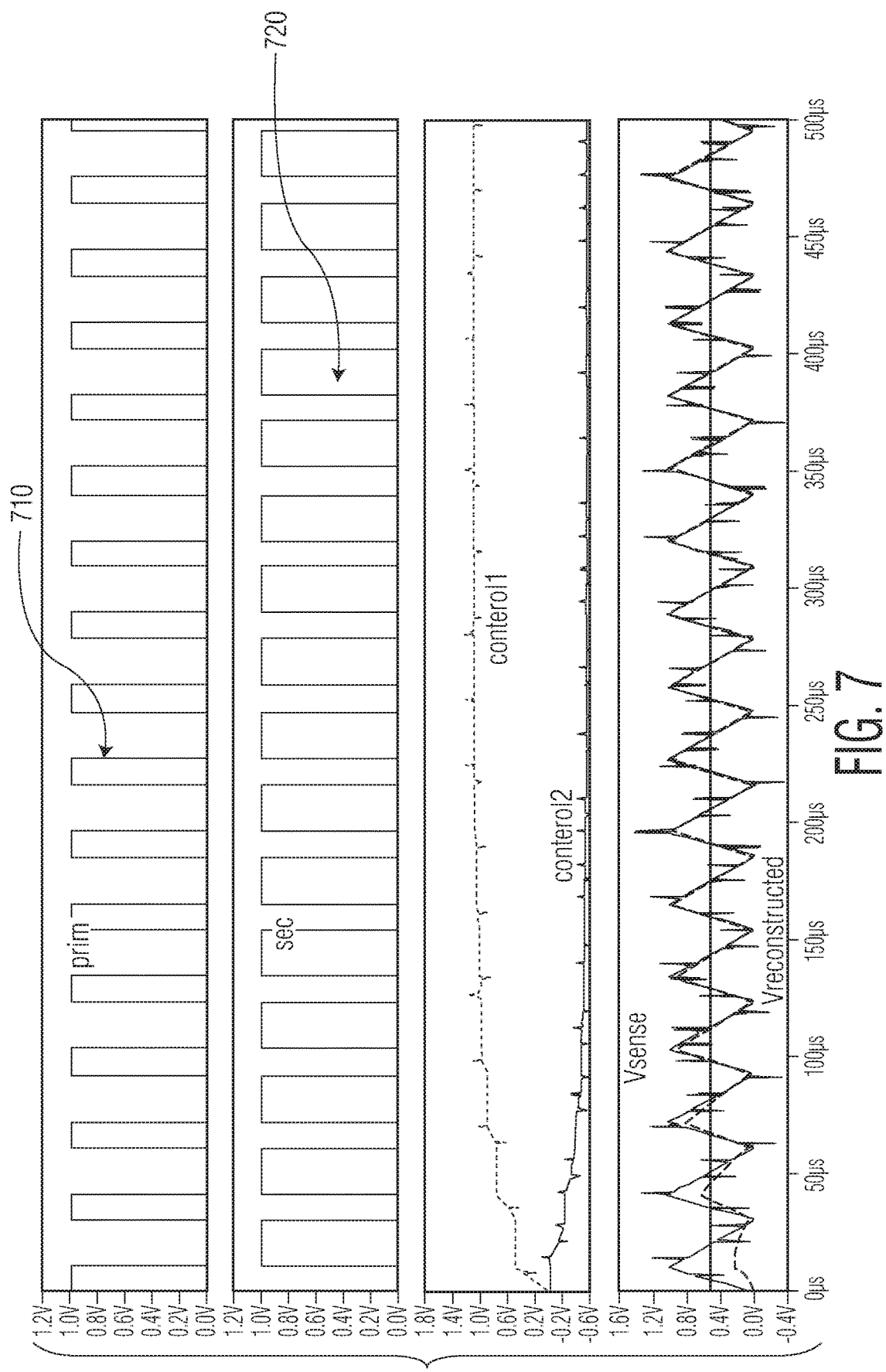
FIG. 7 illustrates a result of the Vreconstructed signal after the secondary stroke in accordance with FIG. 5.

FIG. 7 illustrates a result of the Vreconstructed signal using both the E1 and E2 error signals in accordance with FIG. 5. A gain of the E2 signal determines how fast the DC value settles to the required value. The time constant for setting the DC value is preferably set longer than the period time of the Vsense signal to prevent interference between the E1 and E2 signals Outside the primary 710 or secondary 720 window and assuming DC operation of the boost stage, substantially no current flows in Rsense and dv/dt of Vsense is substantially zero (neglecting a small parasitic ringing effect). This may allow the system to maintain the Vreconstructed signal equal to Vsense=0, as illustrated in FIG. 7 by the close overlap between Vreconstructed and Vsense. After an initial adjustment period, Vreconstructed and Vsense are substantially the same, having substantially the same amplitude and frequency. Alternatively, it is possible to add an additional loop (not illustrated) where the E2 signal is used after the end of the secondary stroke circuit 503 to make Vreconstructed to follow the Vsense ringing.

Example embodiments include that the signal reconstruction can follow fast changes in the original sensed Vsense signal. The slopes after d/dt during primary stroke circuit 501 and secondary stroke circuit 503 are tuned relatively slow. The slopes are determined by input and output voltage of the SMPS, while the output voltage is regulated, and the input voltage will not change very fast. Changes in on-time of the boost switch 114 and duration of primary stroke circuit 501 and secondary stroke circuit 503 can be fast, but as the integrator 510 for signal reconstruction is directly controlled by the timing signals, this fast adaption can be followed directly.

Example embodiments may be used to eliminate ringing from a sensed current in a flyback converter. During both a primary and secondary stroke of a flyback converter, ringing may occur in a sensed current due to parasitics. For this reason, a flyback converter using Ipeak control may use a blanking time where the sensed current signal is blanked such that the primary stroke cannot be finished during the blanking time, as otherwise it could be finished too early because of the ringing. This may be the case because modern flyback converters use higher switching frequencies making the effect of such parasitics problematic. Therefore, replacement of the sensed current by a reconstructed version using example embodiments described herein may implement shorter primary strokes in a well defined way.

Example embodiments may be used to eliminate ringing from a sensed current in a flyback converter during the secondary stroke. A flyback converter with synchronous rectification may use current during the secondary stroke to decide when the synchronous rectifier switch should be turned on and off. Replacement of the sensed secondary current by a reconstructed version using the idea accordance with the reconstruction apparatus 500 of may allow controlled timing for the SR switch.

FIG. 2 illustrates a circuit configured for Vmains sensing in accordance with example embodiments described herein. In an example embodiment, related to the situation of FIG. 2, a reconstruction of the sensed Vmains signal is made.

Figure 8:
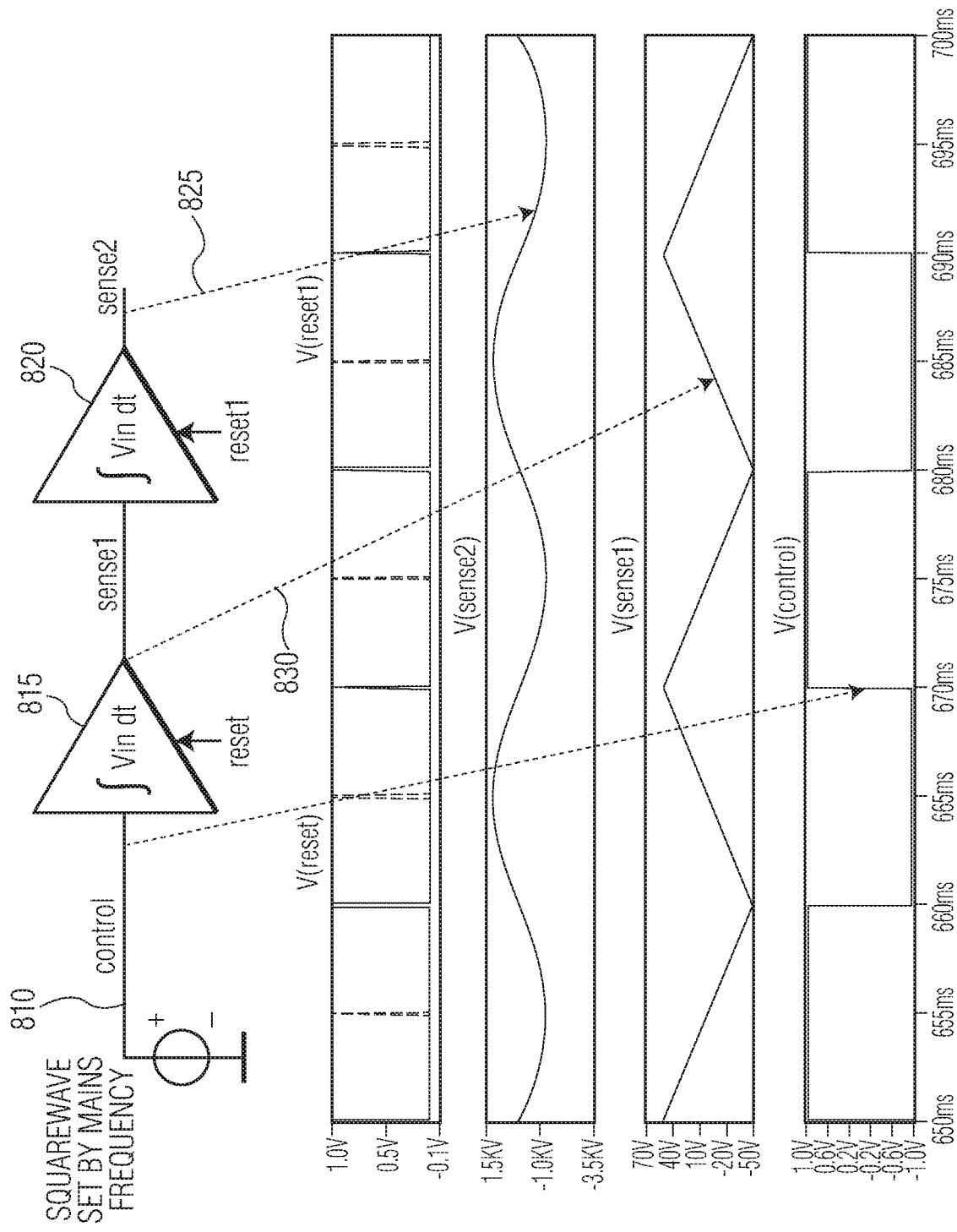
FIG. 8 illustrates reconstruction of a Vmains signal in accordance with FIG. 2.

FIG. 8 illustrates reconstruction of a Vmains signal in accordance with FIG. 2.

As illustrated in FIG. 8, a squarewave signal 810 (V(control)), from which timing is derived from the sensed mains signal 205 from the Vmains processing block 230 of FIG. 2, may be taken as input for two integrators 815 and 820. Double integration of a squarewave 810 may result in an almost an ideal sinewave 825 (sense2) that can be used as replacement of the sensed mains voltage 205. The sensed mains voltage may be in the form of a squarewave. The first integrated signal sense1 may be in the form of a triangular wave. The second integrated signal sense2 may be represented by the sinewave. In order to define a DC component (zero in FIG. 8) two reset inputs (reset and reset1) of the respective integrators 815 and 820 are available. The first integrator 815 may be reset at a middle of each half of the squarewave 810 (reset) while the second integrator 820 may be reset at each slope 830 of the triangular wave (reset1).

Figure 9:
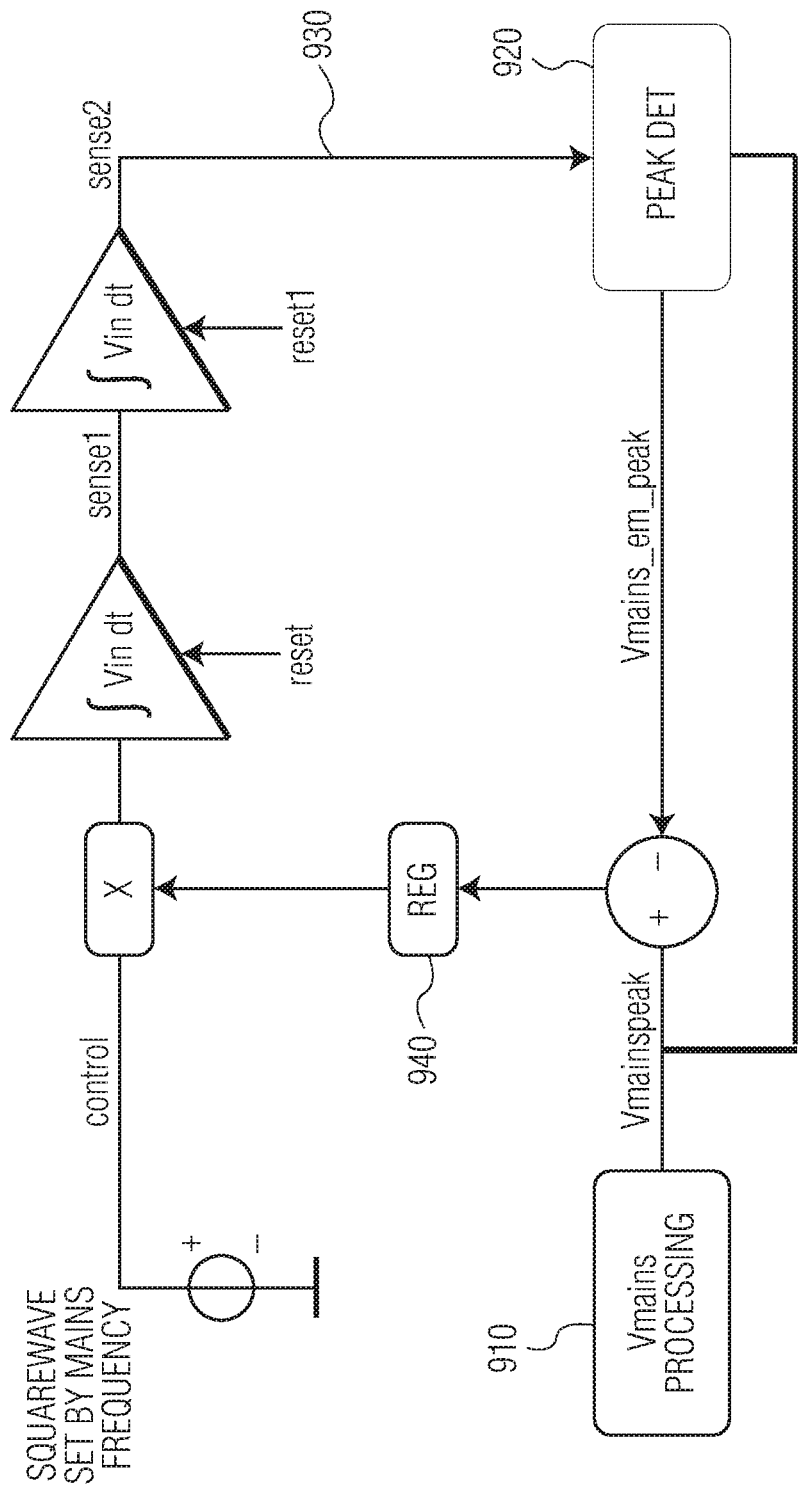
FIG. 9 illustrates an example embodiment related to an amplitude of the reconstructed signal Vreconstructed in accordance with example embodiments described herein.

FIG. 9 illustrates an example embodiment related to an amplitude of the reconstructed signal Vreconstructed in accordance with example embodiments described herein. The Vmains processing block 910 may detect the amplitude of the actual sensed mains signal 205. Internal filtering may be applied to filter out some ringing and noise.

The detected amplitude detected by a peak detector 920 is then compared with a peak value of the sense2 signal 930 and placed into an error loop including a regulator 940 that adapts a parameter related to the amplitude of the reconstructed signal (sense2), for example by multiplying the squarewave signal (control) with the reg output.

As described herein, a sensed signal may be disturbed by undesired other signals. Example embodiments include a method to generate a Vreconstructed shape according to known and detected features of the Vsense signal. A feedback loop including an integrator may be included that is configured to generate a plurality of error signals based on the difference between the Vreconstructed shape and the Vsense signal. Example embodiments may adapt an amplitude of the Vreconstructed shape based on the error signals. Example embodiments use the Vreconstructed shape signal with adapted amplitudes as replacement for the disturbed Vsense signal as part of a switch mode power supply.

Although the various example embodiments have been described in detail with particular reference to certain exemplary aspects thereof, it should be understood that the invention is capable of other example embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

The invention claimed is:

1. A switched mode power supply, comprising: an alternating current power supply configured to output a voltage; a sense resistor configured to sense a voltage in a power factor correction stage; a current sense processor configured to sense a current level through the sense resistor and reconstruct the sensed voltage to eliminate disturbances in the sensed voltage across the sense resistor, wherein the disturbances include voltage spikes in a rising and falling edge of the sensed voltage.

2. The switched mode power supply of claim 1, wherein the current sense processor includes a reconstruction apparatus that is configured to input the sensed voltage having the disturbances and output a reconstructed voltage signal free of the disturbances, wherein the sensed voltage and the reconstructed voltage signal have an amplitude and frequency within a predetermined tolerance.

3. The switched mode power supply of claim 2, wherein the reconstruction apparatus is configured to take a derivative of the sensed voltage and a derivative of the reconstructed voltage and determine a difference therebetween, wherein the difference provides an error signal that is fed back and integrated in the reconstruction apparatus to update the reconstructed voltage.

4. The switched mode power supply of claim 2, wherein the reconstruction apparatus is configured to take the sensed voltage and the reconstructed voltage and determined a difference therebetween, wherein the difference provides an error signal that is fed back and integrated in the reconstruction apparatus to update the reconstructed voltage.

5. The switched mode power supply of claim 2, wherein the reconstruction apparatus includes a primary stroke circuit configured to create a rising edge of the reconstruction voltage signal and a secondary stroke circuit configured to create a falling edge of the reconstruction voltage signal.

6. The switched mode power supply of claim 5, wherein the primary stroke circuit includes a plurality of switches configured to route error signals to an integrator.

7. The switched mode power supply of claim 2, wherein the reconstruction apparatus includes at least one filter, wherein the at least one filter is configured to output a desired slope for the reconstructed voltage signal based upon an error signal.

8. The switched mode power supply of claim 2, wherein the reconstruction apparatus includes at least one filter, wherein the at least one filter is configured to output a desired slope for the sensed voltage when there is no error present.

9. A method of reconstructing a power supply signal, comprising: outputting a power supply voltage; sensing a voltage in a power factor correction stage using a sense resistor; sensing a current level of the output voltage through the sense resistor and reconstructing the sensed voltage to eliminate disturbances in the sensed voltage across the sense resistor, wherein the disturbances include voltage spikes in a rising and falling edge of the sensed voltage.

10. The method of reconstructing the power supply signal of claim 9, further comprising inputting the sensed voltage having the disturbances and outputting a reconstructed voltage signal free of the disturbances, wherein the sensed voltage and the reconstructed voltage signal have an amplitude and frequency within a predetermined tolerance.

11. The method of reconstructing the power supply signal of claim 10, further comprising taking a derivative of the sensed voltage and a derivative of the reconstructed voltage and determining a difference therebetween, wherein the difference provides an error signal that is fed back and integrated in a reconstruction apparatus to update the reconstructed voltage.

12. The method of reconstructing the power supply signal of claim 10, further comprising taking the sensed voltage and the reconstructed voltage and determining a difference therebetween, wherein the difference provides an error signal that is fed back and integrated into a reconstruction apparatus to update the reconstructed voltage.

13. The method of reconstructing the power supply signal of claim 10, further comprising creating a rising edge of the reconstruction voltage signal using a primary stroke circuit and creating a falling edge of the reconstruction voltage signal using a secondary stroke circuit.

14. The method of reconstructing the power supply signal method of claim 13, further comprising routing error signals to an integrator using a plurality of switches.

15. The method of reconstructing the power supply signal of claim 10, further comprising outputting a desired slope by a filter for the reconstructed voltage signal base upon an error signal.

16. The method of reconstructing the power supply signal of claim 10, further comprising outputting a desired slope by a filter for the sensed voltage when there is no error present.

17. A switched mode power supply, comprising:
a Vmains power supply to generate a Vmains signal;
a power factor correction stage to improve a quality of the Vmains signal;
a Vmains processor configured to sense the Vmains signal, wherein the Vmains processor is configured to derive timing from the sensed Vmains signal and to produce a square wave signal based upon the derived timing;
a first integrator to receive the square wave signal and output a first integrated signal;
a second integrator configured to receive and integrate the first integrated signal and output a second integrated signal having a sinewave replacement of the sensed Vmains signal;
wherein the Vmains processor includes a peak detector that detects an amplitude of the sensed Vmains signal;
an error loop, the error loop including,
the peak detector configured to compare the amplitude of the sensed Vmains signal to a peak value of the second integrated signal; and
a regulator configured to adapt a parameter of the amplitude of the second integrated signal by multiplying the Vmains signal with an output of the regulator.

18. The switched mode power supply of claim 17, further comprising a first reset input for the first integrator wherein the first integrator is reset at a middle of each half of the sensed Vmains signal.

19. The switched mode power supply of claim 17, further comprising a second reset input for the second integrator wherein the second integrator is reset at each slope of the first integrated signal.

20. The switched mode power supply of claim 19, wherein the first integrated signal is triangular wave.

21. A switched mode power supply, comprising: an alternating current power supply configured to output a voltage;

a sense resistor configured to sense a voltage in a power factor correction stage; a current sense processor configured to sense a current level through the sense resistor and reconstruct the sensed voltage to eliminate disturbances in the sensed voltage across the sense resistor wherein the current sense processor includes a reconstruction apparatus that is configured to input the sensed voltage having the disturbances and output a reconstructed voltage signal free of the disturbances; wherein the sensed voltage and the reconstructed voltage signal have an amplitude and frequency within a predetermined tolerance; wherein the reconstruction apparatus is configured to take the sensed voltage and the reconstructed voltage and determined a difference therebetween; and wherein the difference provides an error signal that is fed back and integrated in the reconstruction apparatus to update the reconstructed voltage.

22. A method of reconstructing a power supply signal, comprising: outputting a power supply voltage; sensing a voltage in a power factor correction stage using a sense resistor; sensing a current level of the output voltage through the sense resistor and reconstructing the sensed voltage to eliminate disturbances in the sensed voltage across the sense resistor; inputting the sensed voltage having the disturbances and outputting a reconstructed voltage signal free of the disturbances; wherein the sensed voltage and the reconstructed voltage signal have an amplitude and frequency within a predetermined tolerance; and creating a rising edge of the reconstruction voltage signal using a primary stroke circuit and creating a falling edge of the reconstruction voltage signal using a secondary stroke circuit.

\* \* \* \* \*